United States Patent [19]
Babich et al.

[11] Patent Number: 5,286,599
[45] Date of Patent: Feb. 15, 1994

[54] BASE DEVELOPABLE NEGATIVE PHOTORESIST COMPOSITION AND USE THEREOF

[75] Inventors: Edward D. Babich, Chappaqua; Eileen A. Galligan, Hopewell Junction, both of N.Y.; Jeffrey D. Gelorme, Plainville, Conn.; Richard P. McGouey, Carmel, N.Y.; Sharon L. Nunes, Hopewell Junction, N.Y.; Jurij R. Paraszczak, Pleasantville, N.Y.; Russell J. Serino, Ridgefield, Conn.; David F. Witman, Pleasantville, N.Y.

[73] Assignee: International Business Machines Corporation, Armonk, N.Y.

[21] Appl. No.: 766,596

[22] Filed: Sep. 26, 1991

[51] Int. Cl.$^5$ .................... G03C 1/72; G03C 1/73
[52] U.S. Cl. .................... 430/270; 430/283; 430/284; 430/325; 430/323; 430/906; 430/909; 430/914
[58] Field of Search ............ 430/270, 325, 362, 323, 430/313, 280, 909, 906, 914, 283, 284

[56] References Cited

U.S. PATENT DOCUMENTS

| | | | |
|---|---|---|---|
| 4,481,279 | 11/1984 | Naito et al. | 430/280 |
| 4,722,881 | 2/1988 | Ueno et al. | 430/192 |
| 4,865,945 | 9/1989 | Noguchi et al. | 430/192 |
| 4,981,909 | 1/1991 | Babich et al. | 525/102 |
| 5,041,358 | 8/1991 | Hatzakis et al. | 430/280 |
| 5,059,512 | 10/1991 | Babich et al. | 430/280 |
| 5,079,131 | 1/1992 | Thackeray et al. | 430/326 |
| 5,098,816 | 3/1992 | Babich et al. | 430/325 |
| 5,118,582 | 6/1992 | Veno et al. | 430/270 |

FOREIGN PATENT DOCUMENTS

| | | |
|---|---|---|
| 0423446A1 | 4/1991 | European Pat. Off. |
| 0425418A2 | 5/1991 | European Pat. Off. |
| 0502382A1 | 9/1992 | European Pat. Off. |

OTHER PUBLICATIONS

Chem. Abstract, CA110:240234n–Resists for negative-working patterns (Masayuki).

*Primary Examiner*—Marion E. McCamish
*Assistant Examiner*—Rosemary Ashton
*Attorney, Agent, or Firm*—Pollock, Vande Sande & Priddy

[57] ABSTRACT

A composition containing novolak polymer, and/or poly(p-vinylphenol), an organometallic material, an amino polymer a cationic photocatalyst. The composition can also include a cosensitizer material which makes a composition sensitive to near U.V. radiation.

35 Claims, No Drawings

BASE DEVELOPABLE NEGATIVE PHOTORESIST COMPOSITION AND USE THEREOF

TECHNICAL FIELD

The present invention is concerned with compositions which are capable of being imaged upon exposure to actinic radiation and developable in aqueous basic compositions. The compositions of the present invention are also resistant to oxygen-containing plasma. In addition, the present invention is concerned with the use of the compositions in lithography. For example, the compositions of the present invention are suitable for imaging on all optical lithography tools and for packaging applications, such as multi-layer ceramic packaging devices.

BACKGROUND ART

In the manufacture of patterned devices, such as semiconductor chips and chip carriers, the processes of etching different layers which constitute the finished product are among the most crucial steps involved. One method widely employed in the etching process is to overlay the surface to be etched with a suitable mask and then to immerse the substrate and mask in a chemical solution which attacks the substrate to be etched while leaving the mask intact. These wet chemical processes suffer from the difficulty of achieving well-defined edges on the etched surfaces. This is due to the chemicals undercutting the mask and the formation of an isotropic image. In other words, conventional chemical wet processes do not provide the selectivity of direction (anisotropy) considered necessary to achieve optimum dimensional consistent with current processing requirements.

Moreover, such wet etching processes are undesirable because of the environmental and safety concerns associated therewith.

Accordingly, various so-called "dry processes" have been suggested to improve the process from an environmental viewpoint, as well as to reduce the relative cost of the etching. Furthermore, these "dry processes" have the potential advantage of greater process control and higher aspect ratio images.

Such "dry processes" generally involve passing a gas through a container and creating a plasma in this gas. The species in this gas are then used to etch a substrate placed in the chamber or container. Typical examples of such "dry processes" are plasma etching, sputter etching, and reactive ion etching.

Reactive ion etching provides well-defined, vertically etched sidewalls. A particular reactive ion etching process is disclosed, for example, in U.S. Pat. No. 4,283,249 to Ephrath, disclosure of which is incorporated herein by reference.

One problem associated with "dry processing" techniques is providing a patternable material which is sensitive to imaging radiation while, at the same time, being sufficiently resistant to the dry etching environment. In many instances, resistance to the dry etching, such as to the plasma etching active species, results in erosion of the mask material and the loss of resolution of the material employed for preparing the mask in the lithographic exposure to the imaging radiation.

This is true for both positive organic resist materials and negative organic resist materials. A positive resist material is one which on exposure to imaging radiation is capable of being rendered soluble in a solvent in which the unexposed resist is not soluble. A negative resist material is one which is capable of polymerizing and/or insolubilizing upon exposure to imaging radiation.

One type of positive photosensitive material is based upon phenol-formaldehyde novolak polymers. A particular example of such is Shipley AZ1350 which is an m-cresol formaldehyde novolak polymer composition. Such is a positive resist composition and includes therein a diazoketone such as 2-diazo-1-naphthol-5-sulphonic acid ester. In such a composition the diazoketone, during the photochemical reaction, is converted to a carboxylic acid. This, in turn, converts a neutral-organic soluble molecule (the phenolic polymer) to one that is readily soluble in weakly alkali aqueous developer solvents. The composition usually contains about 15%, or so, by weight of the diazoketone compound.

A discussion of various photoresist materials can be found, for instance, in the *Journal of the Electrochemical Society*, Vol. 125, No. 3, March 1980, Deckert et al., "Microlithography-Key to Solid-State Fabrication", pp. 45C–56C, disclosure of which is incorporated herein by reference.

Additional discussion of the use of quinone diazides in light-sensitive applications can be found in "Quinone Diazides", Erschov et al., *Elsevier Scientific Publications*, Amsterdam, 1981, Chapter 8, pp. 282–297, disclosure of which is incorporated herein by reference. In addition, it has been suggested therein to employ condensation products of 1,2-naphthoquinone-5-chlorosulphonic acid and certain silicon derivatives to improve the adhesion property of various films to a substrate whereby the condensation products are employed as light-sensitive backing therefor.

In addition, certain siloxanes have been suggested as reactive ion etch barriers. For instance, see Fried et al., IBM, *Journal Research Development*, Vol. 26, No. 8, pp. 362–371. Also, certain siloxanes have been suggested as e-beam sensitive resists. For instance, see Roberts, *Journal of Electrochemical Society*, Vol. 120, p. 1716, 1973; Roberts, *Phillips Technical Review*, Vol. 35, pp. 41–52; and Gazard, et. al., *Applied Polymer Symposium*, No. 23, pp. 106–107, 1974.

Moreover, there have been suggestions that certain siloxanes, when imaged with electron beam (see Hatzakis et al., *Processing Microcircuit Engineering* (Lausanne), p. 396, September 1981); and deep U.V. at about 2537 Angstrom (see Shaw et al., *SPE Photopolymer Conference*, November 1982) act as an etch mask for an underlying polymer layer in an oxygen plasma. However, those siloxane materials suggested require very limited method for imaging (e.g., e-beam and deep U.V.) and are not imageable with radiation of longer wavelengths (e.g., greater than 2700Å), where the majority of lithographic imaging tools, contact, proximity, and projection printers operate.

U.S. Pat. No. 4,603,195 to Babich et al. discloses materials which are resistant to dry-processing techniques and especially to reactive ion etching in oxygen plasma while, at the same time, capable of providing high resolution images. The compositions disclosed therein are obtained by interreacting a quinone diazo compound and an organosilicon compound.

In addition, examples of some dry-developable resists are provided in U.S. Pat. Nos. 4,426,247 to Tamamura et al.; 4,433,044 to Meyer et al.; 4,357,369 to Kilichowski et al.; 4,430,153 to Gleason et al.; 4,307,178 to Kaplan et al.; 4,389,482 to Bargon et al.; and 4,396,704 to Taylor. In addition, British patent application 2097143 suggests a process for obtaining negative tone plasma resist images. Such is concerned with a process involving entrapment of a silicon-containing monomer into a host film at the time of exposure to radiation and requires a processing step to expel the unincorporated silicon monomer from the film before plasma developing of the relief image.

A more recent example of a plasma developable resist is described in U.S. Pat. No. 4,552,833 in which a method is provided for obtaining a resist which is stated to be radiation sensitive and oxygen plasma developable. Such process involves coating a substrate with a film of a polymer that contains a masked reactive functionality, imagewise exposing the film to radiation under conditions that cause unmasking of the reactive functionality in the exposed regions of the film, treating the exposed film with a reactive organometallic reagent, and then developing the relief image by treatment with an oxygen plasma. The specific organometallic reagents described therein are trimethylstannyl chloride, hexamethyldisilazane, and trimethylsilyl chloride.

Furthermore, a negative resist that is radiation sensitive and resistant to reactive ion etching in oxygen plasma is disclosed in U.S. patent application Ser. No. 07/608,073 now abandoned, disclosure of which is incorporated herein by reference. The compositions therein include a polymeric material obtained by interreacting an epoxy novolak polymer with certain organosilicon compounds and a radiation sensitive onium salt.

The compositions are disclosed as being developable in various organic solvents. In addition, a method of obtaining a two-layer resist by top imaging a single layer resist is described in U.S. patent application Ser. No. 06/679,527, now abandoned, (assigned to the assignee of the present application) which employs a monofunctional organometallic reagent.

Moreover, U.S. patent application Ser. No. 06/713,509 and now U.S. Pat. No. 4,782,008 (assigned to the assignee of the present application) discloses oxygen plasma resistant materials obtained by reacting a polymeric material with a multifunctional organometallic material. The organometallic material contains at least two functional groups which are reacted with reactive groups of the polymeric material. The polymeric material contains reactive hydrogen functional groups and/or reactive hydrogen functional precursor groups.

The disclosures of the above two U.S. patent applications are incorporated herein by reference.

A further disclosure of photosensitive compositions containing organosilicon compounds can be found in U.S. Pat. No. 4,693,960.

Report RJ 4834 by McDonald et al. is of general interest concerning negative tone oxygen plasma developable resist based upon the photogeneration of a reactive functionality within the resist film which reacts with an organometallic reagent.

Moreover, photopolymerizable compositions that contain an epoxy polymer and various radiation sensitive onium salts have been suggested. For instance, see U.S. Pat. Nos. 4,069,055; 4,175,972; 4,572,890; 4,593,052; and 4,624,912.

SUMMARY OF INVENTION

The present invention provides materials that are resistant to dry-processing techniques and especially to reactive ion etching in oxygen plasma, while at the same time capable of providing high resolution images. The compositions of the present invention are capable of being developed using aqueous developing solutions. The materials of the present invention provide for negative resist materials. In addition, the materials of the present invention can be made highly sensitive to e-beam, x-ray, ion beam, deep U.V. irradiation (<3000 angstrøms) and near U.V. radiation (<3000 angstrøms). The compositions of the present invention are thermally stable. In addition, the compositions of the present invention exhibit good adhesion to a variety of substrates.

The present invention is concerned with a composition that contains:
A. a novolak and/or a polyvinylphenol;
B. a di- or polyfunctional organometallic material
C. an amino resin in an effective crosslinking amount; and
D. a cationic-type photocatalyst such as an onium salt in an amount effective to initiate crosslinking of the novolak, organometallic material and amino resin.

Moreover, those skilled in the art will appreciate that the above compositions may also include a near U.V. sensitizer such as anthracene derivatives for exposure at >3000 angstrøms.

The onium salt or other photocatalyst is present in amounts to increase the sensitivity of the composition to e-beam, x-ray, ion beam and deep U.V. irradiation. The sensitizer is present to provide sensitivity to near U.V. radiation.

The present invention is also concerned with a process for providing an image which includes providing on a substrate a layer of the above compositions containing the novolak, organometallic material, amino resin and photocatalyst; imagewise selectively exposing the layer to a source of energy in a desired pattern creating exposed and unexposed regions; causing crosslinking of the novolak, amino polymer and the organometallic material in the exposed regions; developing the layer by removal of the unexposed portions, thereby leaving the desired pattern remaining on the substrate.

BEST AND VARIOUS MODES FOR CARRYING OUT INVENTION

The compositions of the present invention contain a novolak polymer and/or a poly(p-vinylphenol).

The novolac polymers are commercially available thermoplastic polymers and can be prepared by known methods by the reaction of a phenolic material and an aldehyde. The phenol can be a mononuclear or polynuclear phenol. Examples of mononuclear phenols have the formula:

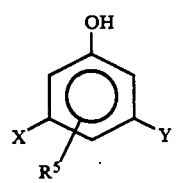

wherein X, Y, and $R^5$ are hydrocarbons containing no more than about 12 carbon atoms.

Hydrocarbon-substituted phenols having positions available for aldehyde condensation include o- and p-cresols, o- and p-ethyl phenols, o- and p-isopropyl phenols, o- and p-tert-butyl phenols, o- and p-sec-butyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-phenyl phenols, o- and p-tolyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde novolak resins include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol; 5-chloro-4-methyl-resorcinol.

Typical phenols which have more than two positions available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol.

Examples of polynuclear difunctional phenols are those having the formula:

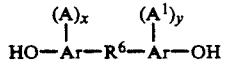

wherein Ar is an aromatic divalent hydrocarbon such as naphthylene and, preferably, phenylene; A and A¹ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and R⁶ is a bond between adjacent carbon atoms as in dihydroxydiphenyl or is a divalent radical including, for example:

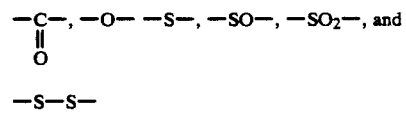

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or R¹ can be polyalkoxy, or polysiloxy, or two or more alkylidene radicals separated by an aromatic ring, a tertiary amino group, or ether linkage, a carbonyl group or a sulfur containing group such as sulfoxide, and the like.

Examples of specific difunctional polynuclear phenols include, among others, the bis-(hydroxyphenyl)alkanes such as 2,2'-bis-(4-hydroxyphenyl)propane, 2,4-dihydroxydiphenylmethane, bis-(2-hydroxyphenyl)methane, bis-(4-hydroxyphenyl)methane, bis(4-hydroxy-2,6-dimethyl-3-methoxyphenyl)methane, 1,1'-bis-(4-hydroxyphenol)ethane, 1,2'-bis-(4-hydroxyphenyl)ethane, 1,1'-bis-(4-hydroxy-2 -chlorphenyl)ethane, 1,1'-bis-(3-methyl-4-hydroxyphenyl)ethane, 1,3-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis-(2-isopropyl-4-hydroxyphenyl)pentane, 2,2'-bis-(4-hydroxyphenyl)-heptane, bis-(4-hydroxyphenyl)phenylmethane, bis-(4-hydroxyphenyl)cyclohexylmethane, 1,2'-bis-(4-hydroxyphenyl)-1-phenyl-propane; di(hydroxyphenyl sulfones such as bis-(4-hydroxyphenyl)sulfone, 2,4;dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorphenyl)ether, bis-(4-hydroxy-3-fluorophenyl)ether, bis-(4-hydroxy-3-bromophenyl)ether, bis-(4-hydroxynaphthyl)ether, bis-(4-hydroxy-3-chloronaphthyl)ether, bis-(2-hydroxydiphenyl)ether, 4,4'-dihydroxy-2,5-diethoxydiphenyl ether.

The preferred difunctional polynuclear phenols are represented by the formula:

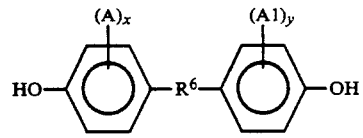

wherein A and A1 are as previously defined, x and y have values from 0 to 4 inclusive and R⁶ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(p-hydroxyphenyl)propane.

As condensing agents, any aldehyde may be used which will condense with the particular phenol being used, including formaldehyde, acetaldehyde, propionaldenhyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin. The preferred aldehyde is formaldehyde.

The preferred novalak materials employed can be represented by the formula:

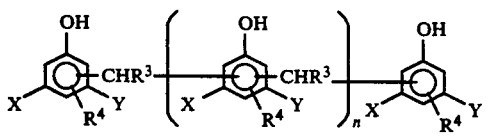

(1)

wherein n is at least about 0.2; $R^3$ is hydrogen or alkyl or alkylene or aryl or aralkyl or alkaryl or cycloalkyl or furyl group; each x and y is individually hydrogen or chlorine or alkyl or hydroxy; each $R^4$ individually is hydrogen or chlorine or a hydrocarbon group such as alkyl, aryl, aralkyl, alkaryl, and cycloalkyl.

The more preferred novolak employed according to the present invention is represented by the formula:

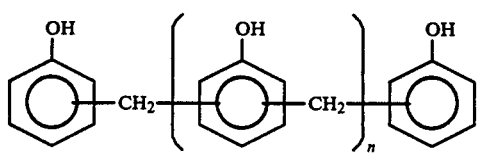

(3)

wherein n is at least about 1. The novolak can be a liquid, semisolid or solid, depending upon its molecular weight. Novolak polymers, wherein n is about 1.5 to about 3.5 are commercially available and are generally suitable for the purposes of the present invention. Still more preferred novolak polymers are represented by the above formula wherein n is at least about 4. The most preferred novolak polymers employed according to the present invention are those wherein n is from about 4 to about 20. Mixtures of novolak polymers of the above formula with different molecular weights can be employed when desired.

Those novolak polymers which are non-liquids are the preferred ones to employ according to the present invention. For instance, the liquid novolak polymers are not particularly preferred since the use thereof does not provide as good pattern definition in screen-printing processes as achieved by using non-liquid novolak polymers because of bleedout occurring during such processes. A discussion of some suitable novolak polymers can be found in publications by "The Chemistry of Phenolic Resins," by R. W. Martin, New York, John Wiley & Sons, Inc., Ltd, 1956, London-Chapman; and M. A. Hartney et al., SPIE, Vol. 1466, p. 238 (1991).

In place of or in addition to the novalak, the present compositions of the present invention can contain a poly(p-vinyl phenol) (as referred to as poly(p-hydroxystyrene). When employed, such should have a molecular weight of about 1,000 to about 50,000. These polymers can be represented by the following formula:

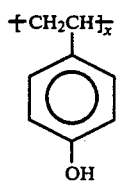

It is critical to the success of the present invention to include in the composition, an amino polymer in an effective crosslinking agent amount. Examples of suitable amino polymers include. Typically, the amino polymers are aminoplast thermosetting polymers obtained by the reaction of an amine, such as urea, melamine, or glycolylurea with an aldehyde, preferably formaldehyde. The preferred amino polymers are dimethylol urea, methylol urea, melamine polymers and urea-formaldehyde polymers such as butylated urea formaldehyde. The most preferred amino polymer employed is hexa(methoxymethyl) melamine. Such is commercially available from American Cyanamide under the trade designation Cymel 303. Other commercially available amino polymers include Resimene 918 and Resimene 747.

The di- and polyfunctional organometallic materials employed pursuant to the present invention include at least two functional groups capable of reacting with amino groups of the amino polymer.

The organometallic material includes compounds with reactive epoxy group or reactive hydrogen group such as $NH_2$, OH and SH. Examples of suitable organometallic materials include organosilicon, organotin, and organogermanium materials including those represented by the formulae:

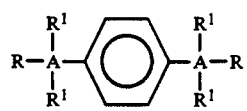

I

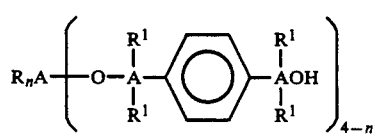

II n = 1 to 3

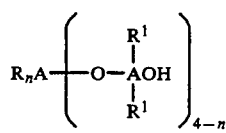

III n = 1 to 3

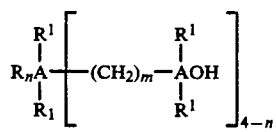

IV n = 1 to 2 m is an integer of 1 to 6

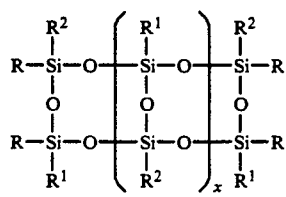

V wherein x is an integer of 1 to about 100 and preferably 1 to 70.

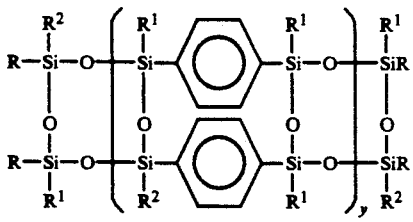

wherein y is an integer of 1 to about 100 and preferably an integer of 1 to 10.

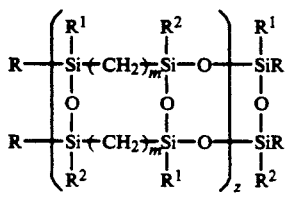

wherein m is an integer of 1 to 8 and preferably an integer of 1 to 3; and z is an integer of 1 to about 100 and preferably 1 to about 10.

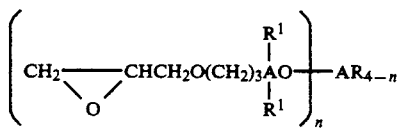

n = 2–4

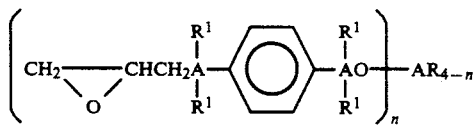

n = 2–4

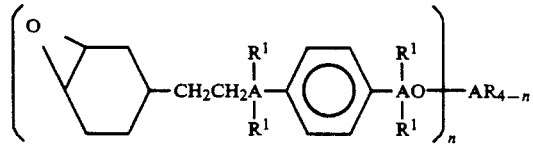

n = 2–4

In the above formulae, each A individually is selected from the group consisting of Si, Sn, and Ge and is preferably Si; each $R^1$ individually is an alkyl group; and $R^2$ individually is an aryl group.

R is a reactive epoxy group or reactive hydrogen group such as $NH_2$, OH and SH.

The $R^1$ and $R^2$ radicals in the above formulae are well-known and are typified by radicals usually associated with silicon-bonded organic groups and silicon-bonded hydrogen groups. Each $R^1$ and $R^2$ radical in the above formulae is individually selected from the group of hydrogen, monovalent hydrocarbon radicals, halogenated monovalent hydrocarbon radicals, epoxy groups, mercapto radicals, and cyanoalkyl radicals. Thus, the radical $R^1$ and $R^2$ may be alkyl, such as methyl, ethyl, propyl, butyl, octyl; aryl radicals such as phenyl, tolyl, xylyl, napthyl radicals; aralkyl radicals such as benzyl, phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, chloromethyl, and other such radicals; cyanoalkyl radicals such as cyanoethyl, and cyanopropyl. Preferably, the radicals represented by $R^1$ and $R^2$ have less than eight carbon atoms and in particular it is preferred that $R^1$ and $R^2$ be methyl, ethyl, or phenyl.

Examples of organosilicon materials suitable for use in the present invention are bis(hydroxydimethylsilyl)-benzene; bis(glycidoxypropyl)-tetramethyldisiloxane, glycidoxypropyltrimethoxysilane, glycidoxyphenyltrimethoxysilane, glycidoxymethylsilanes, tetramethylsiloxanediol; dimethylsiloxanediol; bis(hydroxypropyl)-tetramethyldisiloxane, bis(hydroxymethyl)dimethylsilane, carboxypropyltetramethyldisiloxane, 1,3,5,7-tetrahydroxy-1,3,5,7-tetraphenyltetracyclosiloxane, bis(-hydroxydimethylsilyl)-m-carborane; bis(methoxydimethylsilyl)m-carborane; bis(3-glycidoxylpropyl)tetramethyldisiloxane; 1,3-diphenyltetramethoxydisiloxane, 1,3-diphenyl-1,1,3,3-tetrakis(hydroxydimethylsilyl)-disiloxane; di-(tertbutyl)silanediol; 1,2-bis(trimethoxysilyl)ethane and tetrakis-(p-hydroxydimethylsilylphenylene dimethylsiloxy)silane and hydroxyl, amino, thiol or epoxy-terminated organosilicon glass resins. The organosilicon resins of formulae V, VI, and VII are examples of organosilicon glass resins.

In addition, preferred compounds of formula II are those wherein A is Si and each $R^1$ is methyl. Preferred compounds of formula III are those wherein A is Si and one $R^1$ is methyl and the other R is phenyl. Preferred compounds of formula IV are those wherein A is Si and each $R^1$ is methyl. Preferred compounds of formula VIII, IX and X are those wherein each A is Si, and each $R^1$ is methyl.

The amount of the amino polymer is usually about 0.01 to about 0.25 moles and preferably about 0.1 to about 0.25 moles per mole of the novolak polymer and/or poly(p-vinylphenol) employed.

The amount of the organometallic material is usually about 0.25 to about 1 mole and preferably about 0.5 to about 1 moles per mole of the novolak polymer and/or poly(p-vinylphenol) employed.

The compositions of the present invention also contain a cationic photocatalyst and preferably a radiation sensitive onium salt. The onium salt or other cationic photocatalyst is present in amounts effective to increase the radiation sensitivity of the composition and usually about 1% to about 10% by weight, and preferably about 1% to about 5% by weight based upon the weight of the novolak and/or poly(p-vinyl phenol) employed.

Examples of suitable onium salts include aromatic onium salts of Group IV elements discussed in U.S. Pat. No. 4,175,972, disclosure of which is incorporated herein by reference, and aromatic onium salts of Group Va elements discussed in U.S. Pat. No. 4,069,055, disclosure of which is incorporated herein by reference.

Aromatic Group IVa onium salts include those represented by the formula:

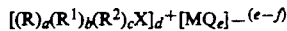

where R is a monovalent aromatic organic radical, $R^1$ is a monovalent organic aliphatic radial selected from alkyl, cycloalkyl and substituted alkyl, $R^2$ is a polyvalent organic radical forming a heterocyclic or fused ring structure selected from aliphatic radicals and aromatic radicals, X is a Group IVa element selected from sulfur, selenium, and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, $$d = e - f$$

f=valence of M and is an integer equal to from 2 to 7 inclusive, e is >f and is an integer having a value up to 8.

Radicals included by R are, for example, C(6-13) aromatic hydrocarbon radicals such as phenyl, tolyl, naphthyl, anthryl, and such radicals substituted with up to 1 to 4 monovalent radicals such as C(1-8) alkoxy, C(1-8) alkyl, nitro, chloro, and hydroxy; arylacyl radicals such as benzyl and phenylacyl; aromatic heterocyclic radicals such as pyridyl and furfuryl. R1 radicals include C(1-8) alkyl such as methyl and ethyl, substituted alkyl such as —C₂H₄OCH₃, —CH₂COOC₂H₅, —CH₂COCH₃. R2 radicals include such structures as:

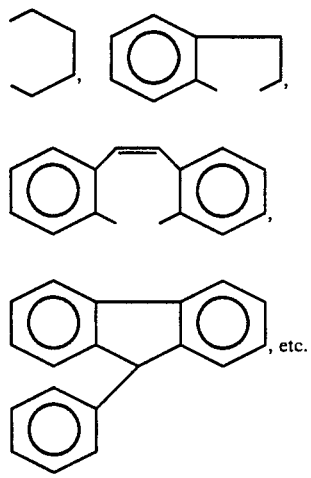

Complex anions included by $MQ_e^{-(e-f)}$ of Formula I are, for example $BF_4^-$, $PF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, actinides, such as Th, Pa, U, Np, and metalloids such as B, P, and As.

Group VIa onium salts included by Formula I are, for example:

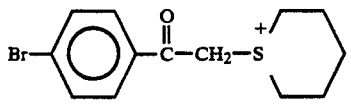

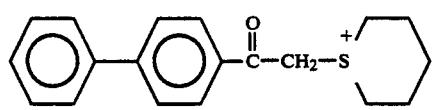

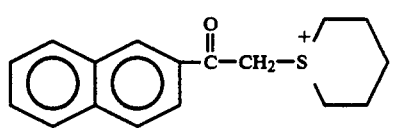

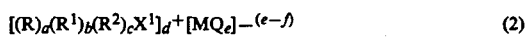

Aromatic group Va onium salts include those represented by the formula:

$$[(R)_a(R^1)_b(R^2)_cX^1]_d^+[MQ_e]^{-(e-f)} \qquad (2)$$

where R is a monovalent aromatic organic radical selected from carbocyclic radicals and heterocyclic radicals, $R_1$ is a monovalent organic aliphatic radical selected from alkyl, alkoxy, cycloalkyl and substituted derivatives thereof, $R_2$ is a polyvalent organic radical forming an aromatic heterocyclic or fused ring structure with $X^1$, $X^1$ is a Group Va element selected from N, P, As, Sb, and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of a+b+c is a value equal to 4 or the valence of $X^1$, $$d = e - f$$

f=valence of M and is an integer equal to from 2 to 7 inclusive, e is >f and is an integer having a value up to 8.

Radicals included by R are, for example, C(6-13) aromatic hydrocarbon radicals such as phenyl, tolyl, naphthyl, anthryl and such radicals substituted with up to 1 to 4 monovalent radicals such as C(1-8) alkoxy, C(1-8) alkyl, nitro, chloro, and hydroxy; arylacyl radicals such as phenylacyl; arylalkyl radicals such as phenyl ethyl; aromatic heterocyclic radicals such as pyridyl and furfuryl; $R_1$ radicals include C(1-8)alkyl, C(3-8) cycloalkyl, substituted alkyl such as haloalkyl, for example, chloroethyl; alkoxy such as $OCH_2C_6H_5$ and $OCH_3$; alkoxyalkyl such as —C₂H₄OCH₃; alkylacyl such as —CH₂COOC₂H₅; ketoalkyl such as —CH₂COCH₃.

Radicals included by $R_2$ are, for example:

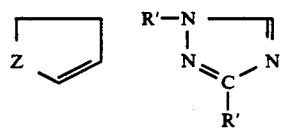

where Q' is selected from O, CH₂, N, R, and S; Z is selected from —O—, —S— and

and R' is a monovalent radical selected from hydrogen and hydrocarbon. Complex anions included by $MQ_e^{-(e-f)}$ are, for example, $BF_4^-$, $PF_6^-$, $AsF_6^-$, $FeCl_4^=$, $SnCl_6^-$, $SbCl_6^-$, $BiCl_5^=$, where M is more particularly a transition metal such as Sb, Fe, Sn, Bi, Al, Ga, In, Ti, Zr, Sc, V, Cr, Mn, and Co; rare earth elements such as the lanthanides, for example, Ce, Pr, and Nd; actinides such as Th, Pa, U, and Ho; and metalloids such as B, P, and As.

In addition, the compositions can be rendered sensitive to near UV radiation such as the addition of an anthracene derivative such as dimethoxy anthracene, 9-anthracene methanol and perylene. The amount of the anthracene derivative, when employed, is usually present in an amount of about 1% to about 20%, and more typically about 2% to about 10% by weight based upon the total amount of the novolak polymer and/or poly(p-vinylphenol), organometallic material and amino polymer.

In addition, it is noted that the compositions of the present invention can be admixed with conventional additives such as fillers, plasticizers, and diluents.

When used as a lithographic material, the compositions of the present invention are applied to a desired substrate to provide films, generally about 1500 angstroms to about 1 mil thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials, polyamides, and polyimides. The dielectric materials may be molded articles of the polymeric materials containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene; polysulfones; polycarbonates; nitrile rubber; and ABS polymers.

The compositions of the present invention can be used as the top imaging layer in a double layer resist system for the oxygen plasma etching of an underlying planarizing polymer layer since the compositions of the present invention are resistant to the conditions of the plasma etching.

The compositions of the present invention, when used in a double layer system, are employed as the top imaging layer. In particular, the compositions of the present invention are exposed to actinic radiation and then developed. Being negative resist materials, that portion exposed to the actinic radiation remains in place and acts as an etch mask for pattern transfer to the underlying planarizing polymer in a reactive ion etching oxygen plasma.

In optical lithography the double-layer system eliminates standing wave effects in resist which cause line width variation when resist is imaged over topographies of different reflectivities and refractive index. Also causing line width variation are differences in exposure dose caused by thickness variations when the planarizing resist layer is coated over topography. These thickness effects are minimized when imaging a uniform thin layer over a planarizing polymer.

In electron beam lithography the double layer system also reduces proximity effects in addition to the other benefits discussed above.

Because the compositions are negative resists, the line width is independent of development time and no swelling has been observed, most likely because the developer is water-based and the film is relatively thin.

The compositions of the present invention, after being coated to the desired thickness upon a substrate, are exposed to the deep to near ultraviolet light, electron beam, X-ray, or ion beams.

The unexposed portions are removed with a basic aqueous solution such as an alkali aqueous solution typically having alkaline normality of about 0.05 to about 0.5 based upon tetramethyl ammonium hydroxide or sodium hydroxide or potassium hydroxide. The compositions can also be used as an etch-stop or barrier in packaging.

The following non-limiting examples are provided to further illustrate the present invention:

EXAMPLE 1

A composition is prepared by admixing about 8.75 parts by weight of Shipley Grade 1 Novalak resin, about 1.25 parts by weight of hexamethylol melamine (Cymel 303); about 5 parts by weight of 1,3,5,7-tetrahydroxy-1,3,5,7-tetraphenyl tetracyclosiloxane, (T-4-monomer) and 5 parts by weight of polyphenylmethylsilsequioxane (silicon polymer GR 950), about 1 part by weight of triphenyl sulfonium hexafluoride antimonate, and about 0.5 parts by weight of 1,4 dimethoxyanthracene in about 30 parts by weight of diglyme.

The composition is spin coated onto a silicon substrate and prebaked for about 1 minute at about 90° C. on a hotplate. The composition is then exposed in a predetermined pattern to irradiation of 365 nm wavelengths at about 120 millijoules/cm², the composition is then post-baked for about 10 minutes at about 90° C. on a hot plate. Next, the composition is developed in an alkali aqueous solution, Shipley Microposit MF312, for about 45 to 60 seconds. Shipley Microposit MF -312 developer is a metal ion free formulation with the total alkaline normality of 0.53–0.55, sodium content of about 0.5 ppm maximum and based upon tetramethylammonium hydroxide which causes no swelling of photoresist. The layer is then rinsed in water for about 30 seconds and then dried by spinning and nitrogen blow dry.

The composition provides high resolution and increased sensitivity, as well as oxygen plasma resistance. The cured composition has an etch rate in an oxygen plasma of only about 60 angstroms/minute. On the other hand AZ-type phenolic photoresists have etch rates of about 700 angstroms/minute in oxygen plasma.

EXAMPLE 2

Example 1 is repeated except that the T4-monomer is replaced by an equivalent amount of bis (hydroxydimethylsilyl)benzene. The results are similar to those of example 1 except that the resistance to oxygen plasma is somewhat higher.

EXAMPLE 3

Example 1 is repeated except that the T4-monomer is replaced by an equivalent amount of polyphenylmethylsilsequioxane under the trade designation GR 950F. The results are similar to those of example 1.

EXAMPLE 4

Example 1 is repeated except the $T_4$-monomer is replaced by an equivalent amount of 1,3-bis(3-hydroxypropyl)tetramethyldisiloxane. The results are similar to those of example 1.

EXAMPLE 5

Example 1 is repeated except the $T_4$-monomer is replaced by an equivalent amount of bis(hydroxymethylsilyl)m-carborane or bis(methoxydimethylsilyl)m-carborane. The results are similar to those of example 1.

EXAMPLE 6

Example 1 is repeated except the $T_4$-monomer is replaced by an equivalent amount of bis(3-glycidoxypropyl)tetramethyldisiloxane. The results are similar to those of example 1.

EXAMPLE 7

Example 1 is repeated except the $T_4$-monomer is replaced by an equivalent amount of 1,3-diphenyltetramethoxydisiloxane. The results are similar to those of example 1.

EXAMPLE 8

Example 1 is repeated except the $T_4$-monomer is replaced by an equivalent amount of 1,3-diphenyl-1,1,3,3-tetrakis(hydroxydimethylsilyl)disiloxane. The results are similar to those of example 1.

EXAMPLE 9

Example 1 is repeated except the $T_4$-monomer is replaced by an equivalent amount of di-(tert-butyl)-silanediol. The results are similar to those of example 1.

EXAMPLE 10

Example 1 is repeated except that the GR 950F glass resin is replaced by an equivalent amount of polyphenylmethylsilsequioxane under the trade designation GR 150F glass resin. The results are similar to those of example 1.

EXAMPLE 11

Example 1 is repeated except that T4-monomer is replaced by an equivalent amount of 1,2-bis(trimethoxysilyl)ethane. The results are similar to those of example 1.

EXAMPLE 12

Example 1 is repeated except that T4-monomer is replaced by an equivalent amount of tetrakis-(hydroxydimethylsilyl-p-phenylenedimethylsiloxy)silane. The results are similar to those of example 1.

What is claimed is:

1. A basic aqueous developed photoresist composition containing a polymer selected from the group consisting of novolak polymer, poly(p-vinylphenol) and mixtures thereof; a di- or polyfunctional organosilicon material containing functional groups capable of reacting with amino groups, an amino polymer having available reactive amino groups in a crosslinking, effective amount, and a cationic photocatalyst in an amount effective to initiate crosslinking of said novolak polymer, or poly(p-vinylphenol), said organosilicon material and said amino polymer.

2. The composition of claim 1 wherein the amount of the organosilicon compound is about 0.25 to about 1 moles per mole of novolak or poly(p-vinylphenol) or both.

3. The composition of claim 1 wherein said polymer is a cresol-formaldehyde polymer.

4. The composition of claim 1 wherein said amino polymer is employed in amounts of about 0.01 to about 0.25 moles per mole of the novolak polymer or poly(p-vinylphenol) or both.

5. The composition of claim 1 wherein said amino polymer is obtained from amine and an aldehyde.

6. The composition of claim 1 wherein said amino polymer is obtained from urea or melamine or glycolylurea and formaldehyde.

7. The composition of claim 1 wherein said amino polymer is a melamine polymer.

8. The composition of claim 1 wherein said amino polymer is hexa(methoxymethyl)melamine.

9. The composition of claim 1 wherein said organosilicon material includes bis(hydroxydimethylsilyl)-benzene or 1,3,5,7-tetrahydroxy-1,3,5,7-tetraphenyltetracyclosiloxane.

10. The composition of claim 9 wherein said onium salt is an aromatic salt of a Group IVa element.

11. The composition of claim 9 wherein said onium salt is triphenyl sulfonium hexafluoride antimonate.

12. The composition of claim 9 wherein the amount of said onium salt is about 1% to about 20% by weight based upon the weight of the polymeric novolak material, or poly(p-vinylphenol) or both.

13. The composition of claim 1 wherein said photocatalyst is a radiation sensitive onium salt.

14. The composition of claim 1 which further contains a diluent.

15. The composition of claim 1 further including a cosensitizer material to make the composition sensitive to near U.V. radiation.

16. The composition of claim 15 wherein said cosensitizer is an anthracene derivative.

17. The composition of claim 15 wherein said cosensitizer is 1,4 dimethoxy anthracene.

18. The composition of claim 1 wherein said poly(p-vinylphenol) has a molecular weight of about 1,000 to about 50,000.

19. The composition of claim 1 wherein said organosilicon material includes 1,3-bis(3-hydroxypropyl)tetramethyldisiloxane.

20. The composition of claim 1 wherein said organosilicon material includes bis(hydroxydimethylsilyl)-m-carborane or bis(methoxydimethylsilyl) m-carborane.

21. The composition of claim 1 wherein said organosilicon material includes bis(3-glycidoxypropyl)tetramethyldisiloxane.

22. The composition of claim 1 wherein said organosilicon material includes 1,3-diphenyltetramethoxydisiloxane.

23. The composition of claim 1 wherein said organosilicon material includes 1,3-diphenyl-1,1,3,3-tetrakis(-hydroxydimethylsilyl)disiloxane.

24. The composition of claim 1 wherein said organosilicon material includes di(tert-butyl)silanediol.

25. The composition of claim 1 wherein said organosilicon material includes 1,2-bis(trimethoxysilyl)ethane.

26. The composition of claim 1 wherein said organosilicon material includes tetrakis-(p-hydroxydimethylsilylphenylenedimethylsiloxy)silane.

27. The composition of claim 1 wherein said organosilicon material includes polyphenylmethylsilsequioxane.

28. The composition of claim 1 wherein said polymer is a novolak polymer

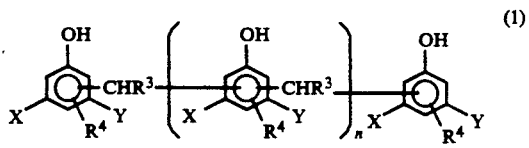

(1)

wherein n is at least about 0.2; $R^3$ is a member selected from the group consisting of hydrogen, alkyl, alkylene, aryl, aralkyl, alkaryl, cycloalkyl and furyl; each x and y is individually a member selected from the group consisting of hydrogen, chlorine, alkyl and hydroxy; each $R^4$ individually is a member selected from the group consisting of hydrogen, chlorine, and hydrocarbon.

29. The composition of claim 1 wherein said polymer is a novolak represented by the formula:

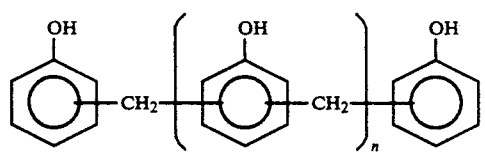

wherein n is at least about 1.

30. A process for producing an image which comprises providing on a substrate a layer of an actinic radiation sensitive negative resist composition containing:

a polymer selected from the group consisting of a novolak polymer, poly(p-vinylphenol) and mixtures thereof;

a di- or polyfunctional organosilicon material containing functional groups capable of reacting with amino groups;

groups in a crosslinking effective amount; and a cationic photocatalyst in an amount effective to initiate crosslinking of said novolak polymer or poly(p-vinylphenol), said organosilicon material and said amino polymer; imagewise selectively exposing said composition to a source of energy creating exposed and unexposed regions to crosslink, said novolak polymer or poly(p-vinylphenol), said organosilicon material and said amino polymer in said exposed regions; developing the layer by removal of the unexposed portions using a basic aqueous solution, thereby leaving the desired pattern of the layer remaining on said substrate.

31. The process of claim 30 further comprises etching the substrate by a dry etching process using the pattern of the layer of said radiation-sensitive negative resist composition as the mask.

32. The process of claim 30 further providing a cosensitizer material to make the resist composition sensitive to near U.V. radiation.

33. The process of claim 31 wherein said dry etching is reactive ion etching emphasizing an oxygen plasma.

34. The process of claim 30 wherein said basic aqueous solution has an alkaline normality of about 0.05 to about 0.5.

35. The process of claim 34 wherein said basic aqueous solution contains a member selected from the group consisting of tetramethyl ammonium hydroxide, sodium hydroxide, and potassium hydroxide.

* * * * *